United States Patent [19]

Yasunari

[11] 4,317,274

[45] Mar. 2, 1982

[54] METHOD OF PRODUCING A SEMICONDUCTOR DEVICE

[75] Inventor: Kenjiro Yasunari, Hinode, Japan

[73] Assignee: Hitachi, Ltd., Tokyo, Japan

[21] Appl. No.: 98,259

[22] Filed: Nov. 28, 1979

[30] Foreign Application Priority Data

Jan. 26, 1979 [JP] Japan .................... 54-7102

[51] Int. Cl.³ ...................... H01L 21/28; H01L 21/26
[52] U.S. Cl. ................................ 29/571; 29/576 B; 29/577 C; 148/1.5; 148/187; 357/23
[58] Field of Search ................. 29/571, 577 C, 576 B; 148/1.5, 187; 357/23, 24

[56] References Cited

U.S. PATENT DOCUMENTS

| | | | |
|---|---|---|---|
| 3,911,471 | 10/1975 | Kooi et al. ........................ | 357/50 |
| 4,012,757 | 3/1977 | Koo ................................. | 357/23 X |
| 4,033,797 | 7/1977 | Dill et al. ........................ | 148/187 |
| 4,081,896 | 4/1978 | Dingwall ........................ | 29/589 X |
| 4,240,845 | 12/1980 | Esch et al. ........................ | 148/188 X |
| 4,251,571 | 2/1981 | Garbarino et al. ............... | 148/1.5 X |

FOREIGN PATENT DOCUMENTS

2814695 10/1978 Fed. Rep. of Germany.
2382768 9/1978 France.

OTHER PUBLICATIONS

IBM Technical Disclosure Bulletin, vol. 20, No. 11A, Apr. 1978, pp. 4286 and 4287.

*Primary Examiner*—G. Ozaki
*Attorney, Agent, or Firm*—Craig and Antonelli

[57] ABSTRACT

This invention relates to a method of producing a semiconductor device, and more particularly to a method of leading out an electrode for a semiconductor substrate. A conductor layer of polycrystalline silicon or the like is formed on the surface of the semiconductor substrate on which the substrate electrode is to be formed, a desired semiconductor region having a conductivity type opposite to that of the substrate is selectively formed under this state, and the semiconductor substrate electrode is formed on the substrate surface after removing the conductor layer.

8 Claims, 17 Drawing Figures

METHOD OF PRODUCING A SEMICONDUCTOR DEVICE

BACKGROUND OF THE INVENTION

This invention relates to a method of producing a semiconductor device such as MOSIC (Metal-Oxide-Semiconductor Integrated Circuit), and more particularly to a technique for forming a substrate electrode by simple treatments. In this specification, the term "MOS" shall be used in a broad sense including the three-layered structure of semiconductor-insulator-conductor.

The substrate electrode of a MOSIC device is usually disposed on the lower surface of a substrate, that is, on a surface opposite to a surface (upper surface) in which source and drain regions or an interconnection layer are/is formed.

On the other hand, in a MOSIC device requiring a high reliability, a resin mold package is often replaced with a ceramic package or a glass package as a sealing member for the device.

In this regard, there has been a problem in the case where the MOSIC device having the substrate electrode on the rear surface of the substrate is sealed with such ceramic package or glass package.

More specifically, in the case of employing the above package, an external lead and the substrate electrode must be connected by means of a wire. However, the wire bonding is very difficult because of the presence of the substrate electrode on the rear substrate surface. For this reason, the speed-up of the automatic wire bonding cannot be achieved satisfactorily.

It has therefore been considered to dispose the substrate electrode on the front surface of the substrate in the case of sealing the device with the ceramic package or the glass package.

Especially, in a silicon gate MOSIC device having a LOCOS (Local Oxidation of Silicon) structure, a source or drain region having a conductivity type opposite to that of a substrate is formed in the front surface of the substrate other than a field oxide film as well as a silicon gate electrode, and hence, there has been considered a method wherein a part of the field oxide film is etched to expose the front substrate surface and wherein the substrate electrode is formed on the exposed front substrate surface.

This method of forming the substrate electrode, however, has had such disadvantages that the stage of work for etching and removing the thick field oxide film needs to be specially added and that the etching and removal of the field oxide film is not easy and takes a long time.

The inventor of this invention took note of the fact that any semiconductor region having the conductivity type opposite to that of the substrate is not formed underneath the gate electrode. This invention has been achieved as the result.

SUMMARY OF THE INVENTION

An object of this invention is to provide an improved method of producing a semiconductor device which has made it possible to form a substrate electrode by comparatively simple treatments.

The subject matter of this invention consists in that a conductor layer is formed in advance on a front substrate surface on which an electrode for a semiconductor substrate is to be formed, that desired semiconductor regions having a conductivity type opposite to that of the substrate are selectively formed under this state, and that the substrate electrode is formed on the front substrate surface after removing the conductor layer.

In consequence, the formation of the substrate electrode can be simply performed in such a way that the thin conductor layer formed on the front substrate surface is etched without etching the thick silicon oxide in a sufficient time as in the prior art.

DESCRIPTION OF THE PREFERRED EMBODIMENTS

Embodiment 1

This embodiment will be described with reference to FIGS. 1–9.

Figure 1:
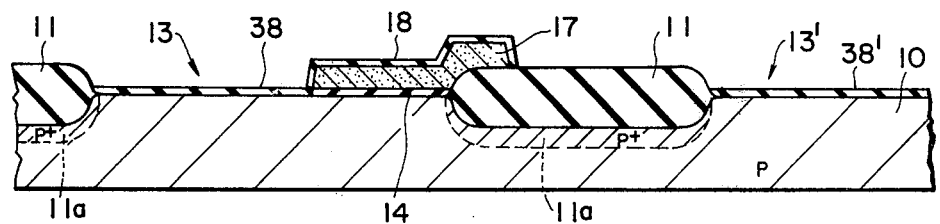
FIGS. 1–9 are sectional views which show a process for producing a MOSIC device according to an embodiment of this invention.

(1) A semiconductor substrate is prepared as shown in FIG. 1. This semiconductor substrate is formed by the following steps. In the front surface of a semiconductor substrate 10 made of P-type silicon, a $P^+$-type region 11a for preventing inversion is formed by selective ion implantation, and a field silicon oxide film 11 being approximately $1\mu$ thick is formed by selective oxidation. In this case, the field oxide film 11 is formed so as to provide an opening 13 in which an active region comprising a one-transistor memory cell including a silicon gate type MOSFET and a MOS capacitor is to be arranged, and also an opening 13' in which a substrate electrode is to be arranged. By oxidizing the substrate surface within the openings 13 and 13', a thin silicon oxide film 14 which is 450 Å thick is formed. Thereafter, a first polycrystalline silicon layer 17 to become one electrode of the MOS capacitor is formed in such a way that a polycrystalline silicon layer having a thickness of 4,000 Å is deposited on the substrate surface and then etched selectively. That part of the silicon oxide film 14 on which the polycrystalline silicon layer 17 is not formed is removed to expose the substrate surface. The surface of the exposed substrate 10 and the surface of the polycrystalline silicon layer 17 are oxidized thereby to form silicon oxide films 38, 38' and 18 simultaneously. The silicon oxide films 38 and 38' are formed to a thickness of about 600 Å. On the other hand, the silicon oxide film 18 formed on the surface of the polycrystalline silicon layer 17 has a thickness of about 1,200 Å.

Figure 2:
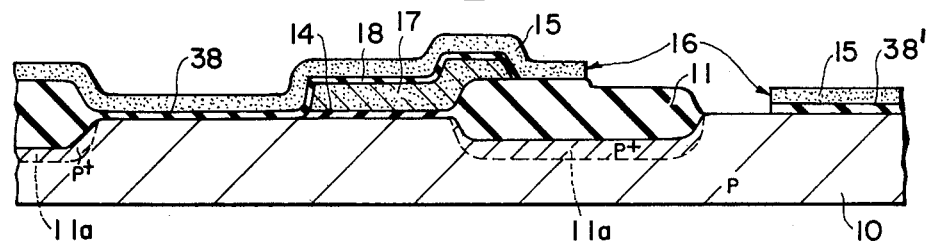

(2) A photoresist film is formed on the substrate surface. By subjecting the photoresist film to an exposure treatment, a photoresist mask 15 for selectively etching the silicon oxide film 38' is formed as shown in FIG. 2. An opening 16 in the photoresist mask 15 is formed so that the field oxide film 11 may be exposed as shown in the figure. This results from the fact that the mask alignment margin has been made sufficient because of the presence of the thick field oxide film 11. Using the photoresist mask 15, the silicon oxide film 38' corresponding to the opening 16 is removed.

Figure 3:
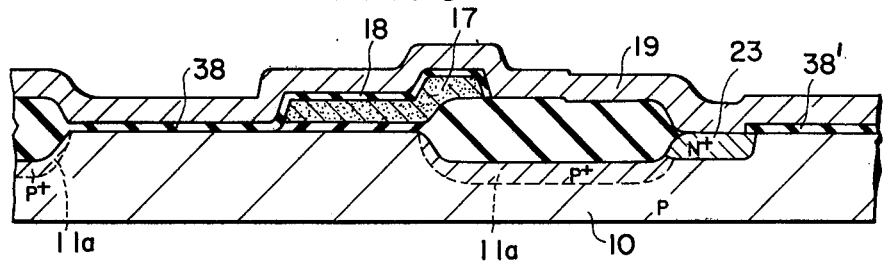

(3) As illustrated in FIG. 3, the photoresist mask 15 is removed, whereupon a second polycrystalline silicon layer 19 having a thickness of 3,500 Å is deposited onto the surface of the substrate 10. Thereafter, the polycrystalline silicon layer 19 is subjected to a phosphorus treatment and converted into a low resistivity layer. Phosphorus is diffused into the substrate 10 during the phosphorus treatment, so that an N+-type guard ring contact region 23 is formed.

Figure 4:
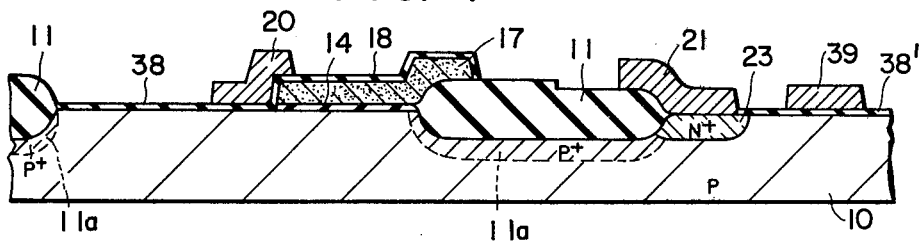

(4) The polycrystalline silicon layer 19 is selectively etched to form polycrystalline silicon layers 20, 21 and 39 having desired shapes as shown in FIG. 4.

Figure 5:
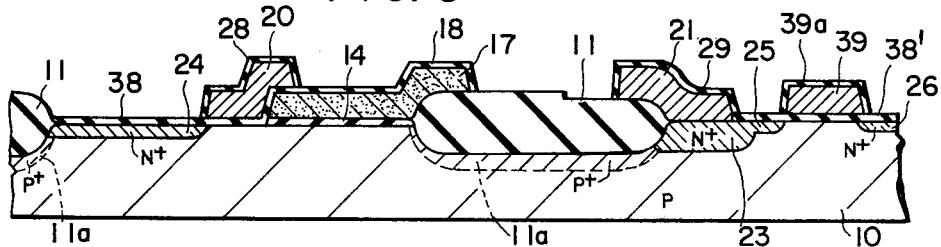

(5) As illustrated in FIG. 5, using the polycrystalline silicon layers 20, 21 and 39 as a mask, ions of a donor impurity such as phosphorus are implanted into selected areas of the substrate surface through the exposed parts of the silicon oxide films 38 and 38'. Thus, an N+-type source region 24, an N+-type guard ring region 25 and an N+-type peripheral region 26 which have the opposite conductivity type to the conductivity type (P) of the substrate are formed. Since, at this time, also the polycrystalline silicon layer 20, 21 and 39 are heavily doped with the donor impurity, they are rendered still lower in resistivity. Then, silicon oxide films 28, 29 and 39a which are 300 Å thick are respectively formed on the surfaces of the polycrystalline silicon layers 20, 21 and 39 by an oxidation treatment.

Figure 6:
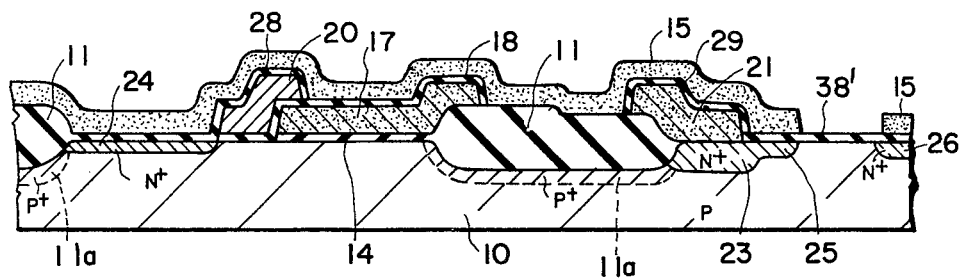

(6) a photoresist mask 15 having an opening by which the silicon oxide film 39a is entirely exposed is formed. Using this photoresist mask 15, the silicon oxide film 39a is removed by the wet etching. Further, the polycrystalline silicon layer 39 is removed by the dry etching such as plasma etching. Then, the silicon oxide 38' is exposed as shown in FIG. 6.

Figure 7:
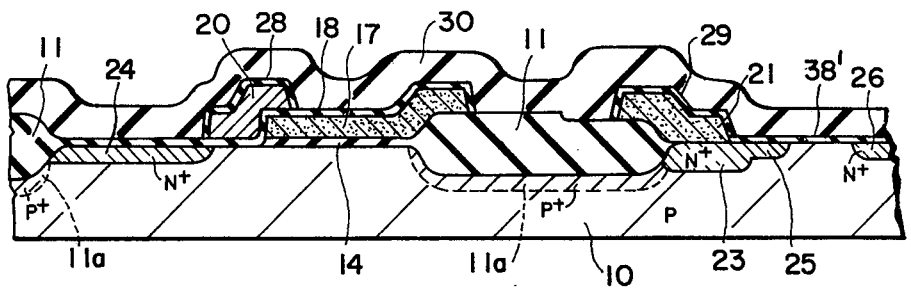

(7) After removing the photoresist mask 15, a passivation film 30 of phosphosilicate glass (PSG) or the like is formed on the upper surface of the substrate 10 by the chemical vapor deposition (CVD) as shown in FIG. 7. The thickness of the passivation film 30 should preferably be on the order of 6,000 Å.

Figure 8:
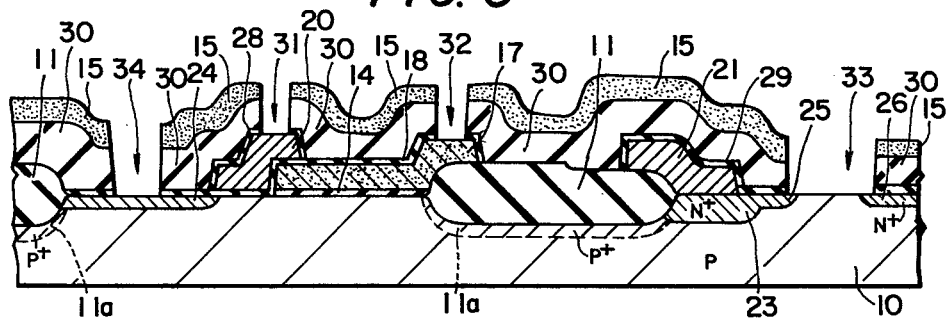

(8) A photoresist film is formed again on the surface of the passivation film 30, and desired positions of the photoresist film are exposed to light, whereby a photoresist mask 15 having a plurality of openings is formed. The passivation film 30 corresponding to the openings and the silicon oxide films 38 and 38' underlying the passivation film areas are etched to form contact holes 31, 32, 33 and 34 as shown in FIG. 8. Thereafter, the photoresist mask 15 is removed.

Figure 9:
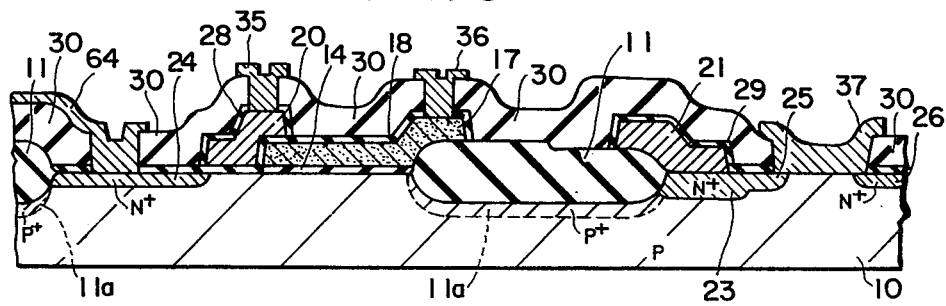

(9) As illustrated in FIG. 9, a gate lead-out electrode 35, an interconnection layer 36 for a potential source and a source electrode 64 which are respectively connected with the second polycrystalline silicon layer 20, the first polycrystalline silicon layer 17 and the N+-type source region 24 through the contact holes 31, 32 and 34 are formed, and simultaneously, the substrate electrode 37 which has been referred to in Item (1) and which lies in ohmic contact with the substrate surface through the substrate contact hole 33 is formed. This substrate electrode 37 is formed into a ring shape. These electrodes are made of aluminum.

According to the embodiment described above, the etching of the polycrystalline silicon layer 39 in Step (6) is good in controllability and is easy and prompt in comparison with the etching of the thick field silicon oxide film because the polycrystalline silicon layer 39 is a porous film. Therefore, it is convenient for suppressing the lowering of the available percentage attendant upon the formation of the substrate electrode and also for shortening the period of time required for the formation of the substrate electrode.

In addition, according to the embodiment, as apparent from Step (8), the substrate contact hole 33 can be formed simultaneously with the contact holes to be formed on the surfaces of semiconductor regions such as the source region 24.

Embodiment 2

This embodiment will be described with reference to FIGS. 10–16.

Figure 10:
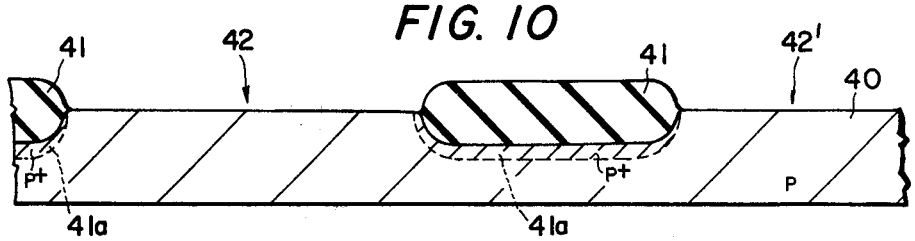
FIGS. 10–16 are sectional views which show a process for producing a MOSIC device according to another embodiment of this invention.

(1) As shown in FIG. 10, in the front surface of a semiconductor substrate 40 made of P-type silicon, a P+-type region 41a for preventing inversion is formed by the selective ion implantation, and a field oxide film 41 being 1μ thick is formed by a selective oxidation treatment. This field oxide film 41 is formed so as to have an opening 42 for arranging an active region therein and an opening 42' for arranging a substrate electrode therein.

Figure 11:
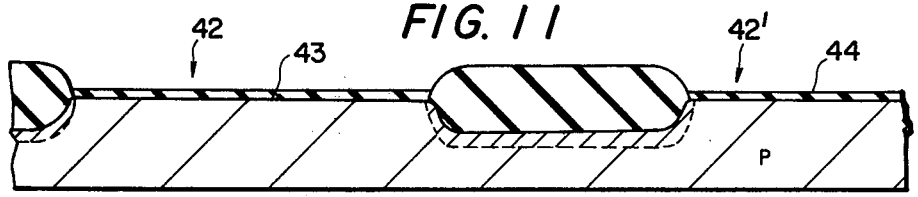

(2) As shown in FIG. 11, silicon oxide films 43 and 44 being 450 Å thick are respectively formed on the parts of the substrate surface within the openings 42 and 42' by an oxidation treatment.

Figure 12:
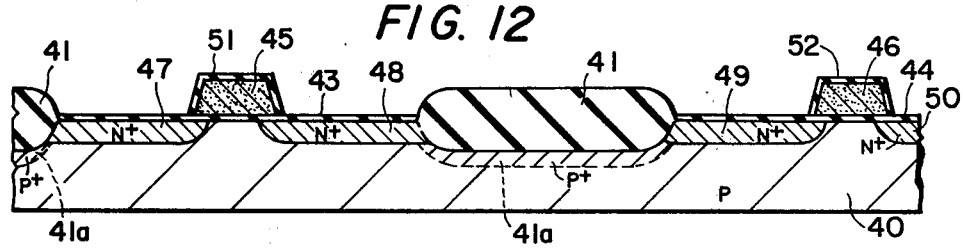

(3) A first layer of polycrystalline silicon having a thickness of 4,000 Å is deposited on the substrate by the CVD process. By selectively etching this polycrystalline silicon, a polycrystalline silicon layer for a gate 45 and a polycrystalline silicon layer for a contact mask 46 are respectively formed on the silicon oxide films 43 and 44. Subsequently, an N+-type source region 47, an N+-type drain region 48, an N+-type guard ring region 49 and an N+-type peripheral region 50 are formed by the selective ion implantation employing the polycrystalline silicon layers 45 and 46 as a mask. Thereafter, the surfaces of the polycrystalline silicon layers 45 and 46 are oxidized to form silicon oxide films 51 and 52 of a thickness of about 1,200 Å respectively. Then, the semiconductor substrate shown in FIG. 12 is obtained.

Figure 13:
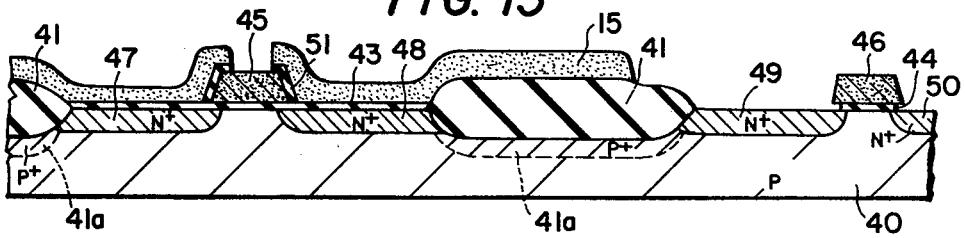

(4) A photoresist mask 15 which has openings in desired positions is formed on the surface of the substrate. As shown in FIG. 13, the exposed silicon oxide films 44, 51 and 52 are removed to exposed a partial surface of the polycrystalline silicon layer 45, the surface of the guard ring region 49 in the substrate, the surface of the polycrystalline silicon layer 46 and the surface of the peripheral region 50 in the substrate.

Figure 14:
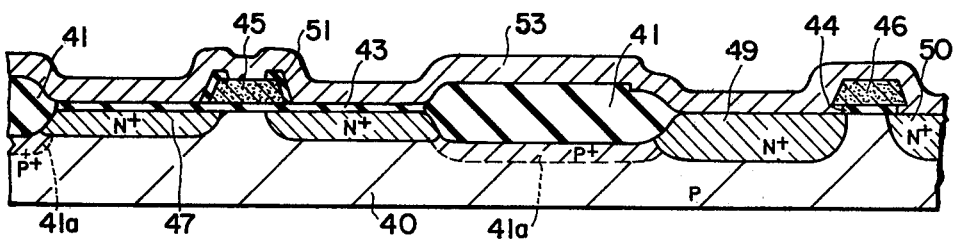

(5) After removing the photoresist mask 15, a second layer of polycrystalline silicon 53 being 4,000 Å thick is formed on the upper surface of the substrate by the CVD process as shown in FIG. 14.

Figure 15:
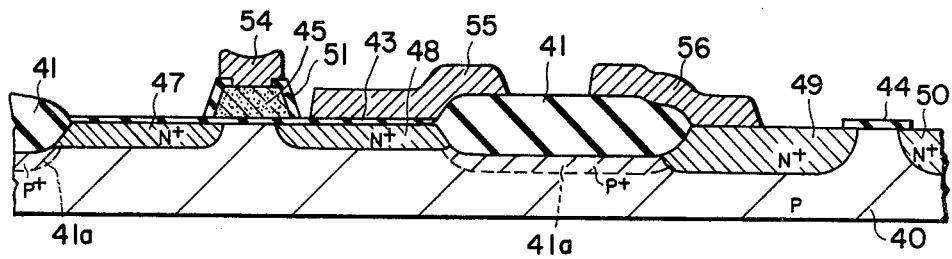

(6) By selectively etching the polycrystalline silicon layer 53, a polycrystalline silicon layer for an etching stopper 54, a polycrystalline silicon layer for a capacitor electrode 55 and a polycrystalline silicon layer for a guard ring contact 56 are formed as shown in FIG. 15. These polycrystalline silicon layers 54, 55 and 56 are heavily doped with an appropriate donor impurity such as phosphorus in the stage of the deposition or later, whereby the layers 54–56 are rendered low in resistivity and simultaneously the N+-type guard ring region 49 as well as the N+-type peripheral region 50 is brought into a desired depth by the impurity-doping through the layer 56. The polycrystalline silicon layer 46 for the mask is simultaneously removed in the selective etching of the second layer of polycrystalline silicon at 54, 55 and 56.

Figure 16:
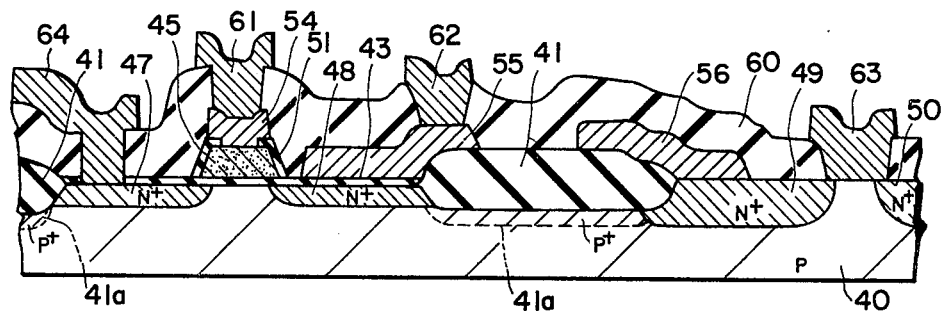

(7) After depositing a passivation film 60 of PSG or the like on the upper surface of the substrate by the CVD process, contact holes are formed by the photoetching likewise to the method stated in Step (8) of Embodiment 1. By the etching treatment at this time, the silicon oxide film 44 is removed to expose the substrate electrode-contact part of the substrate. The polycrystalline silicon layer 54 functions to prevent the silicon oxide film 51 on the surface of the polycrystalline silicon layer for the gate 45 from being excessively etched in the etching of the contact holes. That is, the polycrystalline silicon layer 54 serves as an etch stopper. Thereafter, an electrode metal such as aluminum is vacuum-evaporated on the upper surface of the substrate, and the unnecessary parts thereof are etched and removed. Thus, an interconnection layer 61 for a word line, an interconnection layer 62 for a capacitor electrode, the substrate electrode 63 referred to Step (1) and a source electrode 64 are formed as shown in FIG. 16. The substrate electrode 63 is formed into a ring shape.

According to the embodiment of this invention as described above, both the polycrystalline silicon layer 46 for the mask and the silicon oxide film 44 can be removed by the step of selectively etching the second layer of polycrystalline silicon and the step of selectively etching the silicon oxide for the formation of the contact holes, so that the substrate electrode can be formed without adding any special step of photoetching. Therefore, a sharp curtailment in the number of man-hours and enchancement in the available percentage can be achieved.

The MOSIC device produced by Embodiment 1 or 2 described above is sealed with a ceramic package or glass package.

Figure 17:
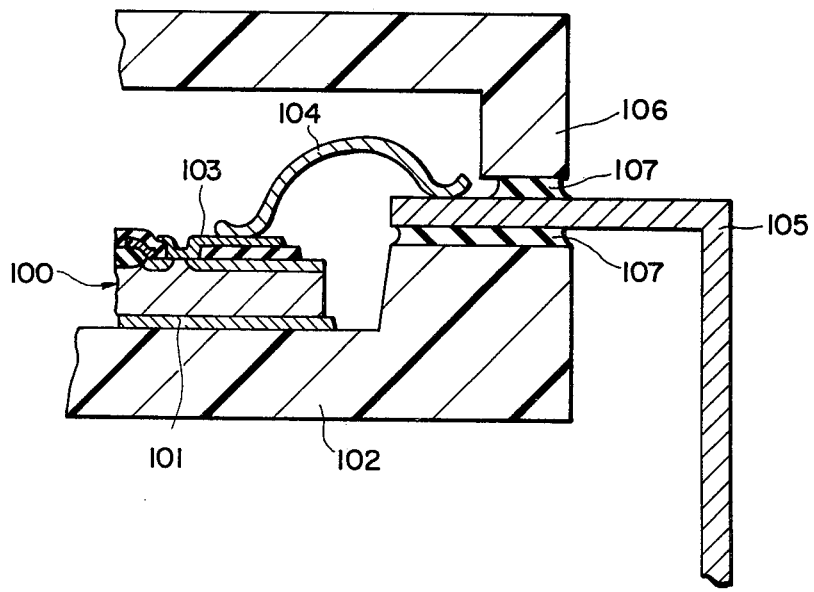
FIG. 17 is a partial sectional view of a MOSIC device produced by the method of this invention as sealed in a package.

FIG. 17 shows a fragmentary sectional view of a glass-sealed MOSIC device. A semiconductor pellet 100 shown in the figure has the structure obtained by the method of Embodiment 2.

Referring to FIG. 17, the semiconductor pellet 100 is bonded on a metalized layer (not shown) of a supporter 102 made from a ceramic material by means of a gold (Au) layer 101. A substrate electrode pad 103 formed on the upper surface of the semiconductor pellet 100 is connected to an external lead 105 by means of a gold wire 104. This lead 105 is secured between the supporter 102 and a cap 106 made from a ceramic material by means of low-melting glass 107.

Since the substrate electrode pad 103 is formed on the upper surface of the substrate as shown in the figure, the wire bonding becomes very simple and the disconnection of the wire is prevented.

In the foregoing embodiments 1 and 2, it is allowed to dispense with the N+-type guard ring contact region 23, the N+-type guard ring regions 25 and 49 and the N+-type peripheral regions 26 and 50. In this case, Step (2) is omitted in Embodiment 1. In Step (4), the polycrystalline silicon layer 39 is formed so as to entirely cover the silicon oxide film 38'. On the other hand, in Embodiment 2, the polycrystalline silicon layer 46 is left behind so as to entirely cover the silicon oxide film 44 is Step (3).

In the embodiments 1 and 2 set forth above, the second layer of polycrystalline silicon may be replaced with a conduction layer of molybdenum or the like which serves as a mask for introducing an impurity.

What is clamed is:

1. A method of producing an MOS integrated circuit device having a substrate electrode comprising the steps of:
forming a field insulating layer on a main surface of a semiconductor substrate so as to surround an active area where a transistor is to be formed, said field insulating layer being formed on said main surface except for a peripheral area of said main surface;
forming a thin insulating layer having a thickness smaller than that of said field insulating layer on said active and peripheral areas;
selectively forming a first conductive layer serving as a gate electrode on said thin insulating layer located on said active area, and simultaneously forming a second conductive layer on said thin insulating layer located on said peripheral area;
introducing an impurity of a conductivity type opposite to that of said semiconductor substrate into said substrate by using said first and second conductive layers and said field insulating layer as a mask, thereby to form in said active area at least one semiconductor region of a conductivity type opposite to that of said semiconductor substrate serving as a source or drain region;
removing said second conductive layer and said thin insulating layer located under said second conductive layer, thereby to expose a surface of said semiconductor substrate at said peripheral area; and
forming a metal layer on said exposed surface at said peripheral area, said metal layer serving as an electrode for said semiconductor substrate which makes ohmic-contact to said semiconductor substrate.

2. A method of producing an MOS integrated circuit device according to claim 1, wherein said first and second conductive layers are made of polycrystalline silicon material.

3. A method of producing an MOS integrated circuit device according to claim 1, wherein said thin insulating layer is formed on the entire surface of said active area, and said semiconductor region is formed by implanting said impurity through said thin insulating layer in said active area not covered by said first conductive layer.

4. A method of producing an MOS integrated circuit device according to claim 1, further comprising the step of forming an electrode for said semiconductor region on the surface of said semiconductor region.

5. A method of producing an MOS integrated circuit device according to claim 4, wherein said electrode for said semiconductor substrate and said electrode for said semiconductor region are simultaneously formed.

6. A method of producing an MOS integrated circuit device according to any one of claims 1–5, wherein said electrode for said semiconductor substrate is formed along the periphery of said semiconductor substrate into a ring shape.

7. A method of producing a silicon gate MOS integrated circuit device having a substrate electrode comprising the steps of:
preparing a silicon semiconductor substrate of a first conductivity type having a main surface;
forming a field oxide layer on said main surface, except for peripheral and active areas of said main surface, so as to surround said active area;
forming a thin oxide layer having a thickness smaller than that of said field oxide layer on said active and peripheral areas;

simultaneously forming a first polycrystalline silicon layer serving as a gate electrode on said thin oxide layer located on said active area, and a second polycrystalline silicon layer serving as a contact mask on said thin oxide layer located on said peripheral area;

introducing an impurity of a second conductivity type opposite to said first conductivity type into said substrate by using said first and second polycrystalline silicon layers and said field oxide layer as a mask, thereby to form at least one semiconductor region of said second conductivity type serving as a source or drain region in said active area;

removing said second polycrystalline silicon layer and said thin oxide layer located under said second polycrystalline silicon layer, thereby to expose a part of said peripheral area into which said impurity is not introduced; and forming a metal layer on said exposed part of said peripheral area, thereby to form a substrate electrode of said silicon semiconductor substrate.

8. A method of producing a silicon gate MOS integrated circuit device according to claim 7, wherein said substrate electrode is formed along the periphery of said silicon semiconductor substrate in a ring shape.

* * * * *